US010749073B2

(12) United States Patent
Rudzinski

(10) Patent No.: US 10,749,073 B2
(45) Date of Patent: Aug. 18, 2020

(54) METHOD FOR PRODUCING LIGHT-EMITTING UV COLUMN STRUCTURES AND THE STRUCTURES PRODUCED USING THIS METHOD

(71) Applicant: Instytut Technologii Materialow Elektronicznych, Warsaw (PL)

(72) Inventor: Mariusz Rudzinski, Warsaw (PL)

(73) Assignee: Instytut Technologii Materialow Elektronicznych, Warsaw (PL)

( * ) Notice: Subject to any disclaimer, the term of this patent is extended or adjusted under 35 U.S.C. 154(b) by 0 days.

(21) Appl. No.: 16/134,056

(22) Filed: Sep. 18, 2018

(65) Prior Publication Data
US 2019/0140135 A1 May 9, 2019

(30) Foreign Application Priority Data
Sep. 20, 2017 (EP) .................................... 17461607

(51) Int. Cl.
| | |
|---|---|
| *H01L 33/20* | (2010.01) |
| *H01L 33/24* | (2010.01) |
| *H01L 33/08* | (2010.01) |
| *H01L 33/16* | (2010.01) |
| *H01L 33/00* | (2010.01) |
| *H01L 33/12* | (2010.01) |
| *H01L 33/32* | (2010.01) |

(52) U.S. Cl.
CPC ............ *H01L 33/20* (2013.01); *H01L 33/007* (2013.01); *H01L 33/0075* (2013.01); *H01L 33/0079* (2013.01); *H01L 33/08* (2013.01); *H01L 33/12* (2013.01); *H01L 33/16* (2013.01); *H01L 33/24* (2013.01); *H01L 33/32* (2013.01)

(58) Field of Classification Search
CPC ... H01L 33/0075; H01L 33/007; H01L 33/16; H01L 33/08; H01L 33/32; H01L 33/24; H01L 33/20; H01L 33/12
See application file for complete search history.

(56) References Cited

U.S. PATENT DOCUMENTS

| | | | |
|---|---|---|---|
| 7,521,274 B2 | 4/2009 | Hersee et al. | |
| 10,374,124 B2 * | 8/2019 | Jang | ........................ H01L 33/58 |
| 2004/0048471 A1 * | 3/2004 | Okagawa | ................ C30B 25/18 |
| | | | 438/689 |
| 2004/0206299 A1 * | 10/2004 | Tadatomo | ............... C30B 25/02 |
| | | | 117/84 |
| 2008/0036038 A1 | 2/2008 | Hersee et al. | |
| 2011/0204378 A1 * | 8/2011 | Su | ....................... H01L 21/0242 |
| | | | 257/76 |
| 2015/0108428 A1 * | 4/2015 | Shatalov | ............. H01L 21/0242 |
| | | | 257/18 |

(Continued)

FOREIGN PATENT DOCUMENTS

| | | | | |
|---|---|---|---|---|
| EP | 3460858 A1 * | 3/2019 | ......... | C23C 16/0227 |
| WO | 2016087509 A1 | 6/2016 | | |

*Primary Examiner* — Joseph C. Nicely
(74) *Attorney, Agent, or Firm* — Ziegler IP Law Group, LLC

(57) ABSTRACT

A method for producing light-emitting UV column structures using the epitaxy of the organometallic compounds of the gaseous phase on a PSS plate having a surface for epitaxy provided with protrusions with a regular shape, having a tip and a side surface, in particular protrusions with a conical shape. The present disclosure also includes structures produced using this method.

4 Claims, 7 Drawing Sheets

(56) References Cited

U.S. PATENT DOCUMENTS

Figure 1:
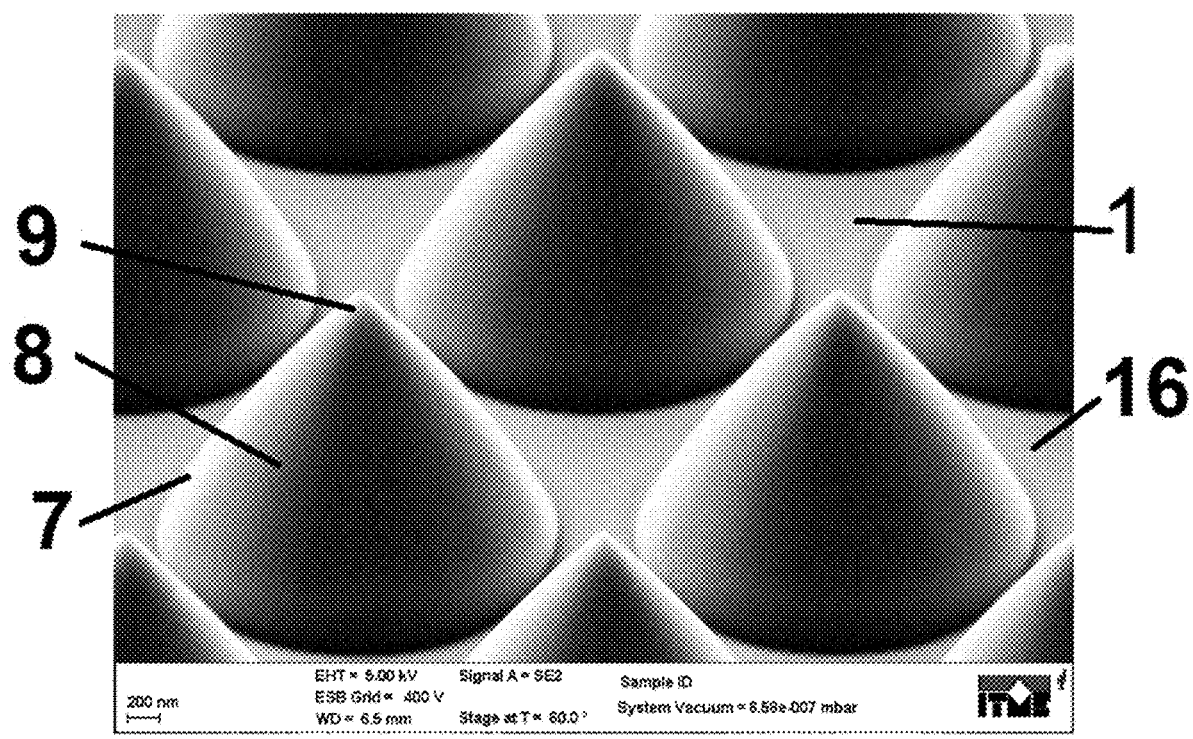

| | | | |
|---|---|---|---|
| 2015/0372190 A1* | 12/2015 | Hirayama | H01L 21/0254 |
| | | | 257/99 |
| 2016/0013362 A1 | 1/2016 | Heo et al. | |
| 2016/0141447 A1* | 5/2016 | Michiue | H01L 21/02505 |
| | | | 257/76 |
| 2018/0182615 A1* | 6/2018 | Okuno | H01L 33/12 |
| 2018/0182919 A1* | 6/2018 | Okuno | H01L 33/20 |

* cited by examiner

METHOD FOR PRODUCING LIGHT-EMITTING UV COLUMN STRUCTURES AND THE STRUCTURES PRODUCED USING THIS METHOD

The aspects of the disclosed embodiments are directed to producing light-emitting UV column structures of increased power and illumination surface and the structures produced using this method.

STATE OF THE ART

Document WO2016087509A1 describes a solution of a light-emitting diode glowing in green or red, emitting a wave with a length ranging from 430 nm to 570 nm, made on a substrate with numerous columns on the substrate material GaN. On the GaN columns produced by the growth of crystals on a substrate masked with $SiO_2$, the subsequent layers of material are deposited, doped with, e.g. InGaN. The technology for producing a LED diode glowing in the visible light range with a larger illumination surface described in the document uses columns on a GaN substrate as a substrate with a larger surface. The shape of the columns results from the shape of apertures in the mask and not from the structure of the crystal lattice. In here, the columns constitute a substrate supporting the remaining structure; their crystalline structure is not controlled, due to which the produced structures would have a lighting performance and emitted wavelength being random and variable within a wide range.

Documents U.S. Pat. No. 7,521,274 and US20160013362A1 describe a GaN structure in the form of nanocolumns produced by the growth of crystals of group 3 elements and gallium, including GaN, by a properly prepared masked substrate. The length, cross-section, orientation, position and other features of the columns may be precisely shaped during growth. Subsequent layers are deposited on the produced columns. The prepared GaN columns may form complex matrices for the preparation of LED structures or lasers. The described disclosure is characterised by similar disadvantages compared to the one described in the document WO2016087509A1.

SUMMARY

The essence of the present disclosure is a method for producing light-emitting UV column structures using the epitaxy of the organometallic compounds of the gaseous phase on a PSS plate having a surface for epitaxy provided with protrusions with a regular shape, having a tip and a side surface, in particular protrusions with a conical shape, characterised in that it comprises the stages of:

A. depositing a low-temperature AlN nucleation layer (also called nucleic) (2) on the protrusions (7) of the PSS substrate (1), in particular on the side surface of a protrusion (8) and on the tip of a protrusion (9) in that in a temperature from 600° C. to 750° C., preferably 680° C., with a pressure within a range from 0 to 200 mbar, preferably 50 mbar, the flow of gases is triggered: trimethylaluminium (TMA) 5 ml/min and ammonia (NH3) 300 ml/min for a duration from 30 seconds to 6 min, preferably 3 min, with a simultaneous rotation of the PSS substrate (1) in a horizontal plane with a speed from 0 to 100 rpm, preferably 50 rpm;

B. growing a grain (10) on at least one tip of the protrusion (9) by increasing the temperature of the PSS substrate (1) with a speed from 30 to 100° C./min, preferably 75° C./min, to a temperature in the range from 1100° C. to 1400° C., preferably 1150° C., and annealing for a duration from 1 to 10 minutes, preferably 2.5 minutes, and subsequently, with a pressure within a range from 0 to 200 mbar, preferably 50 mbar, triggering the flow of gases: trimethylaluminium (TMA) 50 ml/min and ammonia (NH3) variable linearly from 50 ml/min to 5 ml/min over a duration from 1 to 60 minutes, preferably 35 minutes, with a simultaneous rotation of the PSS substrate (1) in a horizontal plane with a speed from 0 to 100 rpm, preferably 50 rpm;

C. expanding the grain (10), in that the temperature is maintained within a range from 1100° C. to 1400° C., preferably 1150° C., with a pressure within a range from 0 to 200 mbar, preferably 50 mbar, and the flow of gases is maintained: trimethylaluminium (TMA) 50 ml/min and a constant flow of ammonia (NH3) 5 ml/min for a duration from 5 to 15 minutes, preferably 10 min, with a simultaneous rotation of the PSS substrate (1) in a horizontal plane with a speed from 0 to 100 rpm, preferably 50 rpm;

D. growing a column (11) on the grain surface (10) by depositing an AlxGa(1−x)N layer with a decreasing Al content (4), where 0≤x≤1, in that the temperature is maintained within a range from 1100° C. to 1250° C., preferably 1150° C., with the pressure within a range from 0 to 200 mbar, preferably 50 mbar, the flow of gases is triggered: trimethylaluminium (TMA) 25 ml/min and the linearly variable flow of trimethylgallium (TMG) from 1 ml/min to 20 ml/min over a duration from 30 to 60 minutes, preferably 45 min, and the flow of trimethylaluminium (TMA) up to 5 ml/min, with a simultaneous rotation of the PSS substrate (1) in a horizontal plane with a speed from 0 to 100 rpm, preferably 50 rpm;

E. depositing another AlxGa(1−x)N layer with a constant Al content (6) on the layer deposited in the said stage D, where 0≤x≤1, in that the temperature is maintained within a range from 1100° C. to 1200° C., preferably 1150° C., with a pressure within a range from 0 to 200 mbar, preferably 50 mbar, the flow of gases is triggered: trimethylaluminium (TMA) within a range from 5 to 50 ml/min, preferably 30 ml/min, the flow of trimethylgallium (TMG) from 1 to 50 ml/min for a duration from 1 to 30 minutes, preferably 15 min, with a simultaneous rotation of the PSS substrate (1) in a horizontal plane with a speed from 0 to 100 rpm, preferably 50 rpm.

Preferably, stage A is preceded by an additional stage of cleansing the PSS substrate (1) by its preliminary annealing in an atmosphere of $H_2$ and/or $N_2$ or their mixtures, with a pressure within a range from 0 to 200 mbar, preferably 50 mbar, and a temperature from 1000° C. to 1400° C., preferably 1150° C., with a simultaneous rotation of the PSS substrate (1) in a horizontal plane with a speed from 0 to 100 rpm, preferably 50 rpm.

Preferably, after the said stage of cleansing, the temperature of the PSS substrate (1) is lowered to a temperature within a range from 600° C. to 750° C., preferably 650° C., with a speed from 50° C. to 200° C., preferably 120° C./min.

Preferably, the doping of the AlxGa(1−x)N layer with a constant Al content (6) is realized in stage E, where 0≤x≤1, by an n-type dopant, e.g. silicon, and/or a p-type dopant, e.g. magnesium, in that a compound comprising the dopant or its precursor, preferably selected from a group comprising:

silane $SiH_4$, Bis(cyclopentadienyl)magnesium $(Cp_5H_5)_2Mg$, is added to the growth environment (to a reactor) in which the growth proceeds.

A semiconductor structure in the form of a column embedded on a substrate in the form of a PSS plate provided with protrusions of a regular shape, having a tip and a side surface, in particular protrusions of a conical shape, the height to width ratio of the column being at least 1:1 and the column having a polycrystalline layer in a part of the column placed between the side surface of the protrusion from the PSS substrate and the monocrystalline layer of the column, which is placed in the upper part of the column, distant from the PSS substrate, according to the invention is characterised in that the contact surface (12) between the polycrystalline layer (13) and the monocrystalline layer (14) has the shape of a cone with a tip shared with the protrusion (7) from the PSS substrate (1), and the monocrystalline layer (14) constitutes at least a part of the sidewalls (15) of the column (11).

The aspects of the disclosed embodiments also comprise a semiconductor structure comprising at least two structures described above, the distance between the two closest walls of the two neighbouring columns ranging from 300 to 700 nm.

A PREFERABLE EMBODIMENT

The aspects of the disclosed embodiments will now be presented in more detail in a preferable embodiment, with reference to the attached drawings, in which:

FIG. 1 Presents a PSS substrate (1) along with protrusions (7) having a side surface of the protrusion (8) and a tip of the protrusion (9). Between the protrusions (9) there is a flat part (16).

Figure 2:
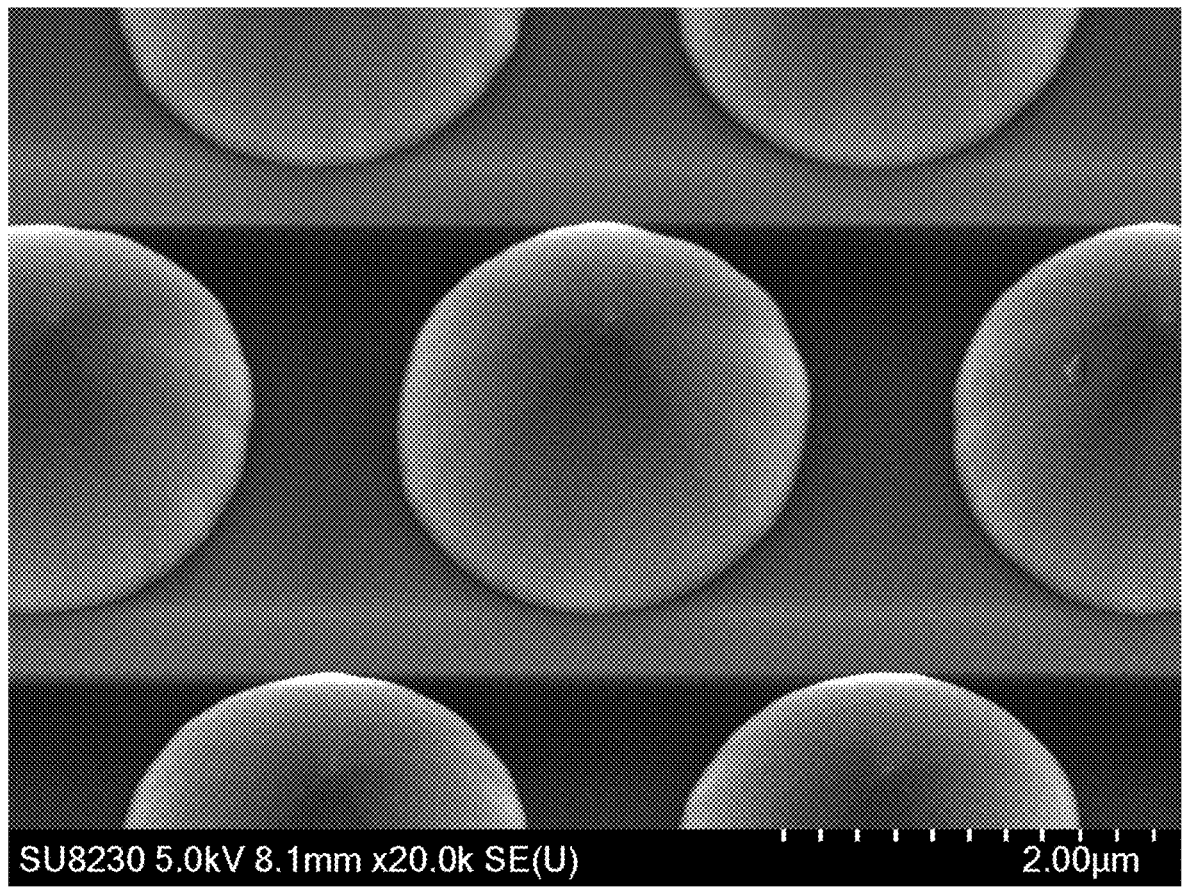

FIG. 2 A low-temperature AlN (N—AlN) nucleation layer (2) after annealing, meaning recrystallisation in 1100° C. and over a duration of 2.5 minutes.

Figure 3:
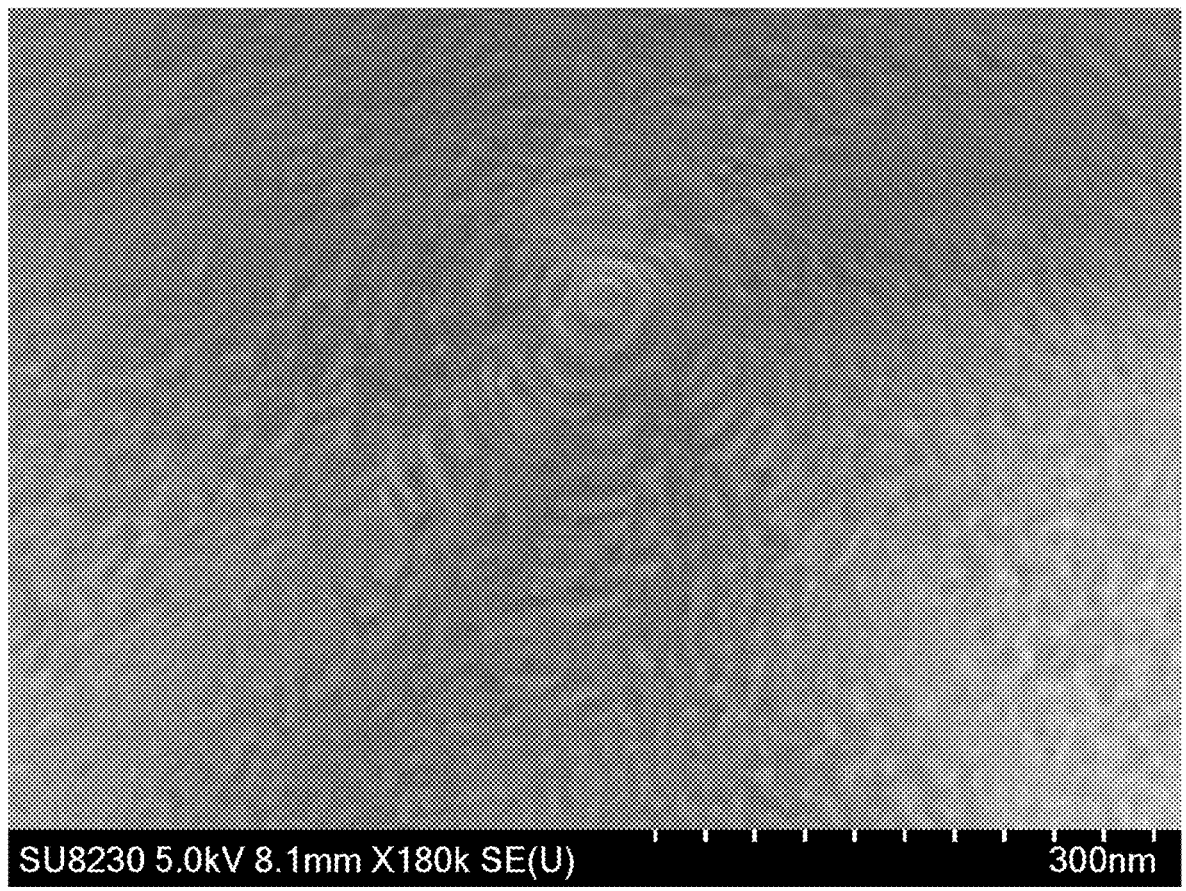

FIG. 3 The tip of the protrusion (9) with a deposited low-temperature AlN (N—AlN) nucleation layer (2) with the shape of a hexagon, which proves a well-defined crystallographic orientation. The direction of crystallisation is perpendicular to the surface of the PSS substrate (1) and it is the direction [0001]. Around it there are many visible other crystallites with a different crystallographic orientation, but regularly distributed around, which is closely related to the shape of the protrusions (9), and thus a local exposition of the individual crystallographic planes of sapphire, which may locally enable growth in more privileged crystallographic directions.

Figure 4:
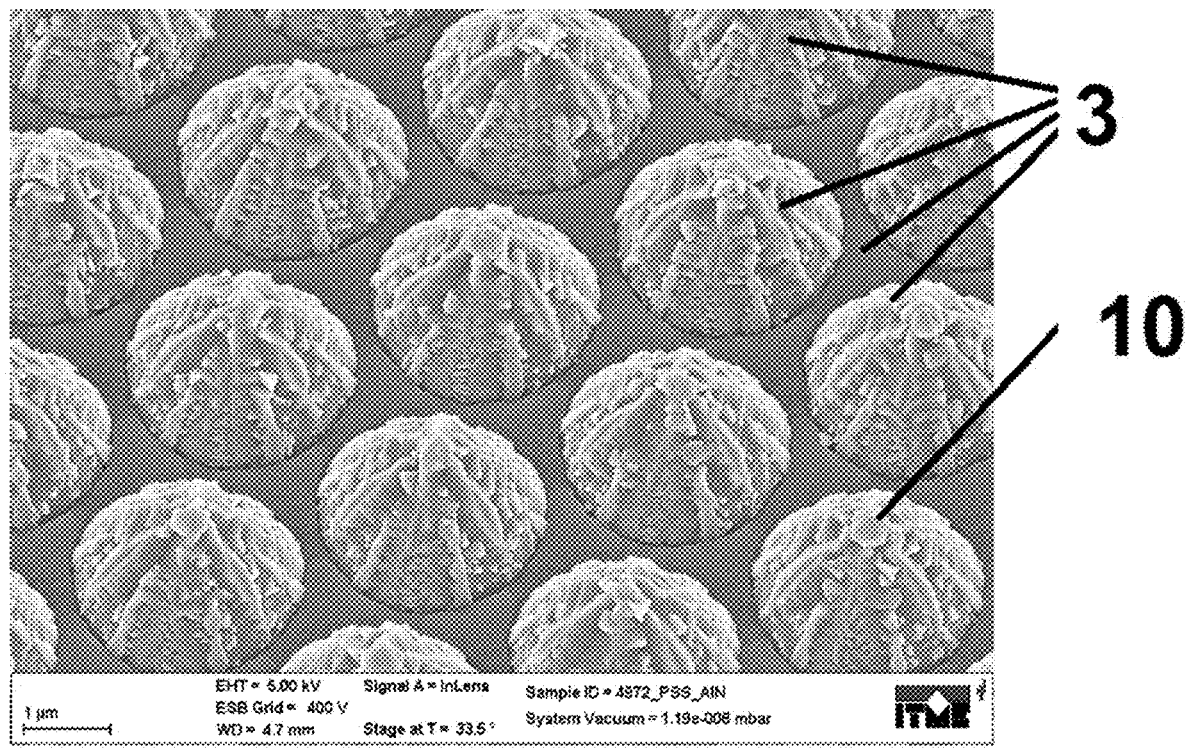

FIG. 4 A high-temperature AlN-1 layer (HT AlN) (3). On the tips of the protrusions (9) there are clearly visible grains (10).

Figure 5:
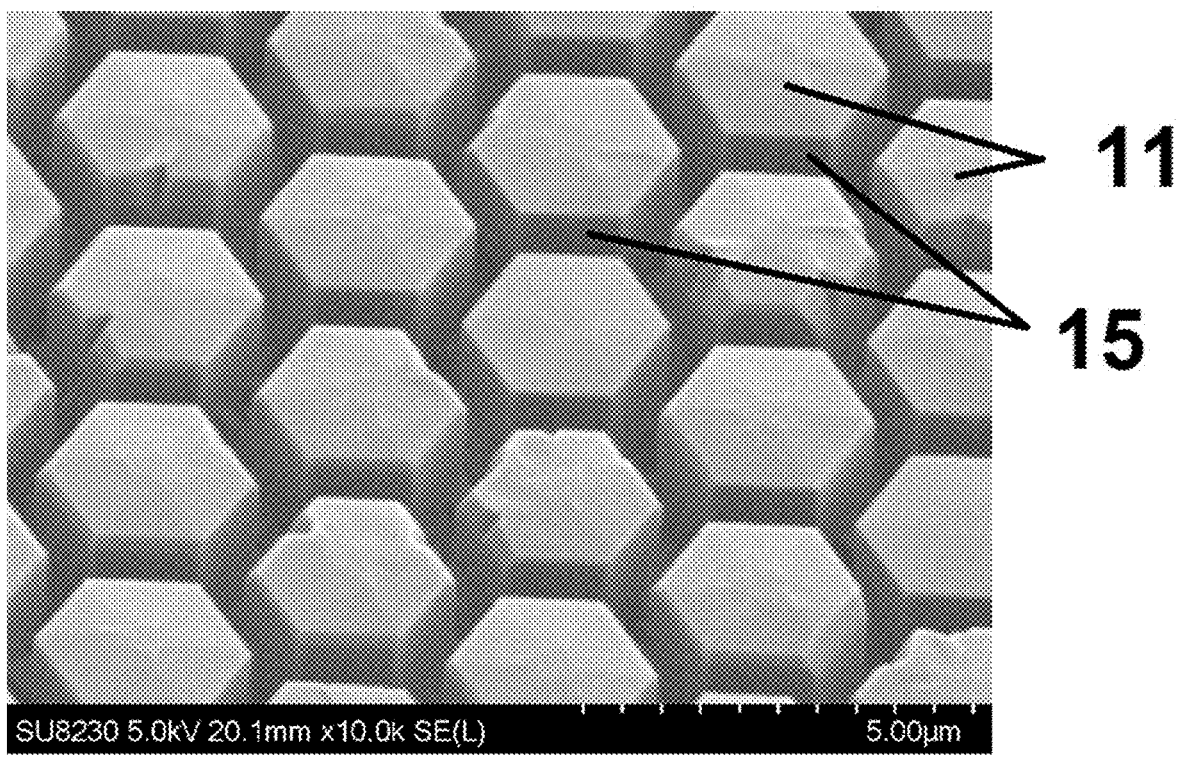

FIG. 5 An SEM image depicting a structure having columns (11) in an axonometric view with visible sidewalls (15).

Figure 6:
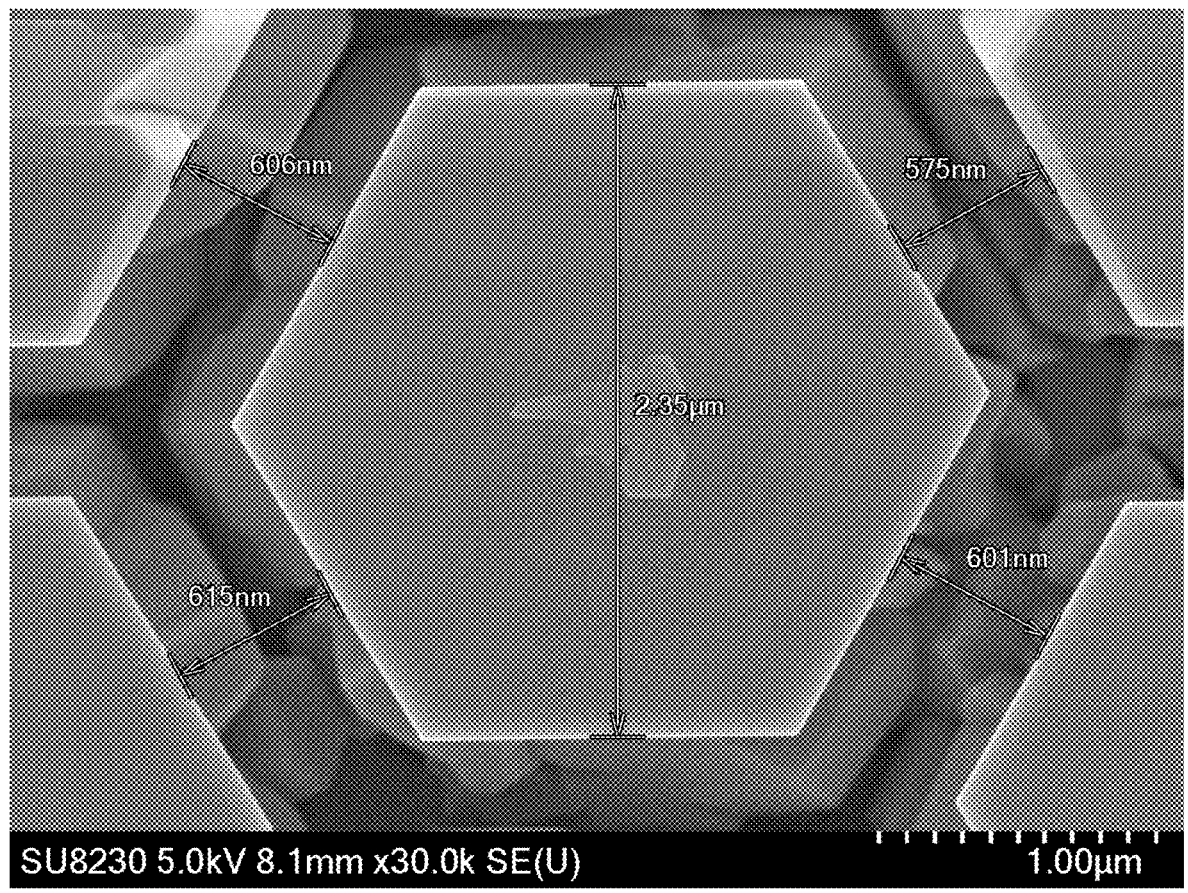

FIG. 6 An SEM image depicting a structure having columns (11) in a top view depicting distances between the columns (11).

Figure 7:
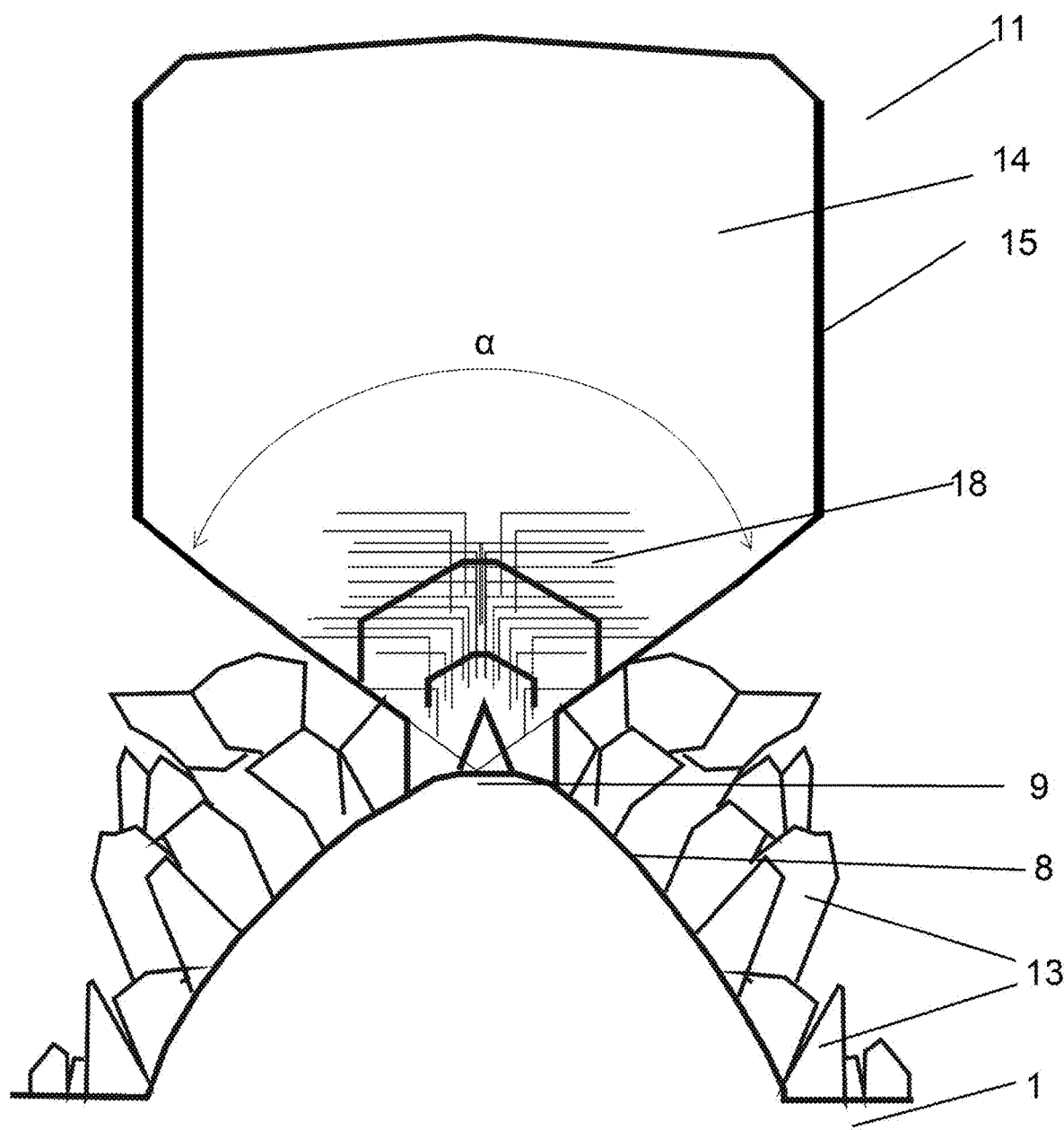

FIG. 7 A schematic drawing of the cross-section of the column (11) with a visible polycrystalline layer (13) embedded on the protrusion (7) of the PSS substrate (1). The monocrystalline layer (14) has the shape of a cone with a tip shared with the protrusion (7) and an angle)(0<a≤270° and it constitutes at least parts of the sidewalls (15). Strand dislocations (18) extending in parallel to the PSS substrate (1) extend from the tip shared with the protrusion (7).

The description of the device in which the aspects of the disclosed embodiments were implemented:

A commercial device for epitaxy from organometallic compounds in the gaseous phase in a lowered pressure (LP MOVPE—Low Pressure Metal-Organic Vapour Phase Epitaxy, or LP MOCVD—Low Pressure Metal-Organic Chemical Vapour Deposition), a level (horizontal) reactor from the AIXTRON company, device model AiX2004RF-S designed for one two-inch substrate plate. It is also possible to implement the invention on other reactors of this type adjusted to the generation of layers from the AIII-BV group of materials, even vertical reactors for multi-serial production enabling the generation of several to several dozen two-inch plates or a lower number of 3-inch, 4-inch, 6-inch, 8-inch etc. substrate plates in one step.

The layers of the structure:
6 An AlxGa(1−x)N layer with a constant Al content
5 An AlxGa(1−x)N layer with a variable (decreasing) Al content from AlN to AlxGa(1−x)N
4 A high-temperature AlN-2 layer (HT AlN)
3 A high-temperature AlN-1 layer (HT AlN)
2 A low-temperature AlN (LT NL AlN) nucleation layer (also called nucleic)
1 A PSS substrate Description of the Process:

The PSS substrate (1) (Patterned Sapphire Substrate), having a surface for epitaxy provided with protrusions with a regular shape, having a tip (9) and a side surface (8), in particular protrusions of a conical shape, is preliminarily annealed in the atmosphere of $H_2$ and/or $N_2$ or a mixture thereof, with a pressure of 50 mbar (possible 0-200 mbar) and a temperature of 1150° C. (possible from 1000° C. to 1400° C.), with a simultaneous rotation of the PSS substrate (1) in a horizontal plane with a speed of approximately 50 rpm (possibly from 30 to 100 rpm). Subsequently, its temperature is lowered to 680° C. (with a speed of ~120° C./min), switching to AlN crystallisation temperature. The parameters of crystallisation are: a pressure of 50 mbar (also possible 0-200 mbar) and a temperature of 680° C. (possible 600-750° C.), the flow of gases is triggered: trimethylaluminium (TMA) 5 ml/min, ammonia (NH3) 300 ml/min. Layer crystallisation time is 4 min (possible time from 30 s to 6 min), table rotations 50 rpm (possible from 30 to 100 rpm).

At this stage, a low-temperature AlN nucleation layer (2) is generated on the protrusions (7) of the PSS substrate (1) and on the flat part (16) placed between the protrusions (7).

Prior to applying a high-temperature AlN-1 layer (3), the temperature is increased to 1100° C. (with a speed of ~150° C./min) and annealing of the low-temperature nucleation layer (2) is conducted for 2.5 minutes, which is when recrystallisation of the deposited AlN polycrystalline layer occurs.

At this stage, crystallisation nuclei (17) are generated as a result of the recrystallisation of nuclei on the protrusions (7) of the PSS substrate (1) and on the flat part (16) located between the protrusions (7). Whereas the crystallographic orientation of the individual nuclei (17) depends on the shape of the protrusion (7), and thus on the local exposure of the individual crystallographic planes of sapphire, which may locally enable the growth of AlN (or recrystallisation) in more privileged crystallographic directions, due to which the nuclei and subsequently crystallites of AlN are generated on the surface of the protrusion (7) with various directions of crystallisation and they depend on the place on the protrusion in which the crystallisation nucleus was originally placed. However, the most important thing is that a properly oriented AlN crystallite called in the present description a "grain" (10), from which the column (11) will grow, is generated on the tip (9) of the protrusion (7).

Subsequently, a high-temperature AlN-1 layer (3) is produced; to this end, an AlN crystallisation temperature of 1150° C. is reached (possible range from 1100° C. to 1400° C.). The parameters of crystallisation are: a pressure of 50 mbar (possible 0-200 mbar and above) and a temperature of 1150° C. (possible range from 1100° C. to 1400° C.), the flow of trimethylaluminium (TMA) 50 ml/min, the flow of ammonia (NH3) linearly variable from 50 ml/min to 5 ml/min over a timeframe of 35 minutes. The layer crystallisation time is 35 min, table rotations 50 rpm (possible range from 0 to 100 rpm). The layer crystallisation speed is approximately 9 nm/min.

At this stage, the growth of AlN crystallites is generated on the protrusions (7) of the PSS substrate (1) and on the flat part (16) located between the protrusions (7), the directions of AlN crystallisation depend on the place in which the given crystallisation nucleus was located (generated). The grains (10), located on the tips of the individual cones of the PSS substrate (1), start crystallising faster and, by growing slightly up and sideways, increasing their volume. In this manner a high-temperature AlN-1 layer (HT AlN) (3) is generated.

In order to produce another high-temperature AlN-2 layer (4), an AlN crystallisation temperature of 1150° C. is maintained (possible range from 1100 to 1400° C.), but with a constant low flow of ammonia. The parameters of crystallisation are: a pressure of 50 mbar (possible 0-200 mbar) and a temperature of 1150° C. (possible range from 1100 to 1400° C.), the flow of gases: trimethylaluminium (TMA) 50 ml/min, constant flow of ammonia (NH3) 5 ml/min. The layer crystallisation time is 5 min, table rotations 50 rpm (possible range from 0 to 100 rpm). The layer crystallisation speed is approximately 9 nm/min. In this manner a high-temperature AlN-2 layer (HT AlN) (4) is generated.

Alternatively, the same effect may be achieved by:
  shortening the crystallisation time of the high-temperature AlN-1 layer (3) and extending the crystallisation time of the high-temperature AlN-2 layer (4).
  extending the crystallisation time of the high-temperature AlN-1 layer (3) and shortening the crystallisation time of the high-temperature AlN-2 layer (4).
  excluding the high-temperature AlN-2 layer (4) and properly selecting the time for the high-temperature AlN-1 layer (3).

At this stage, further growth of grains (10) (crystallisation nuclei located on the tips (9) of the protrusions (7) of the PSS substrate (1)) is generated. They are enlarged planarly and vertically. Crystallites with a uniform hexagonal shape and homogeneous crystal system are created, their diameter being smaller than the cone base diameter. These crystallites begin to dominate in this area, however, they are surrounded by multiple crystallites with different planes and directions of crystallisation.

Another AlxGa(1−x)N layer with a variable (decreasing) Al content (5) is generated with an Al content from AlN to AlxGa(1−x)N, where 0≤x≤1. The composition of this layer is regulated depending on the needs or the requirements of the final structure with a specified application, e.g. a UV-LED diode emitting light with a specified wavelength, e.g. 260 nm. The parameters of crystallisation are: a pressure of 50 mbar (possible range 0-200 mbar) and a temperature of 1110° C. (possible range from 1100° C. to 1250° C.), the flow of trimethylaluminium (TMA) of 25 ml/min, a linearly variable flow of trimethylgallium (TMG) from 1 ml/min to, e.g. 20 ml/min over a duration of 50 minutes (possible range from 1 ml/min to 90 ml/min). It is also possible to generate an AlxGa(1−x)N layer with a variable (decreasing) Al content (5) with a linearly variable flow of gases: trimethylaluminium (TMA) 25 ml/min to, e.g. 5 ml/min, with a simultaneous linearly variable flow of trimethylgallium (TMG) from 1 ml/min to, e.g. 20 ml/min, in order to obtain a higher Al content in the AlxGa(1−x)N layer. The layer crystallisation time is 50 minutes (possible range from 30 minutes to 70 minutes), table rotations 50 rpm. The crystallisation speed of the AlxGa(1−x)N layer with a variable (decreasing) Al content (5), depending on the Al content, is from 8 to 15 nm/min. Depending on the needs, this layer might be doped to the n-type, e.g. with silicon, or the p-type, e.g. with magnesium. Doping is performed by adding to the environment of epitaxial growth proper chemical compounds containing the dopant or its precursor. For example, for n-type doping, such compounds are: silicon—acquired from $SiH_4$ silane, and for p-type doping: magnesium—acquired from Bis(cyclopentadienyl)magnesium $(Cp_5H_5)_2Mg$.

It is also possible to generate an AlxGa(1−x)N layer with a constant Al content (6), e.g. 60%, 30%, while retaining the parameters of crystallisation enabling the expansion of the grain (10) and a column growth.

At this stage, by accelerating crystallisation and a lateral expansion of the main crystallite on the individual tips (9) of the protrusions (7), the expansion of crystallites surrounding the main crystallite is blocked. This may be defined by a cut-off angle a. Due to the process of closure, by the domination of the process of lateral crystallisation (lateral expansion of AlN crystallites, i.e. expansion in a direction generally parallel to the surface of the PSS substrate (1), an almost complete elimination of threading dislocations (18) which occur as a result of a network mismatch between the PSS plate (1) and AlN takes place. The typical density of these dislocations is $10^9$-$10^{10}$ cm$^{-2}$. In the case of this solution, STEM images taken on thin slices cut along the columns (11) through the centre of the columns showed an almost complete reduction of dislocations in the resulting columns.

The subsequent layer is the AlxGa(1−x)N layer with a constant Al content (6), where 0≤x≤1. The composition of this layer is regulated depending on the needs, or the requirements of the final structure with a specified application, e.g. a UV-LED diode emitting light with a specified wavelength, e.g. 300 nm. The parameters of crystallisation are: a pressure of 50 mbar (possible range 0-200 mbar) and a temperature of 1110° C. (possible range from 1100° C. to 1250° C.), the flow of gases: trimethylaluminium (TMA), e.g. 25 ml/min, the flow of trimethylgallium (TMG), e.g. 20 ml/min. The layer crystallisation time is 15 minutes, table rotations 50 rpm. The crystallisation speed of the AlxGa(1−x)N layer, depending on the composition, stabilizes at a level of 30 nm/min. Depending on the needs, this layer might be doped to the n-type, e.g. with silicon, or the p-type, e.g. with magnesium.

Doping is performed by adding proper chemical compounds containing the dopant or its precursor to the environment of epitaxial growth. For example, for n-type doping such compounds are: silicon—acquired from $SiH_4$ silane, and for p-type doping: magnesium—acquired from Bis (cyclopentadienyl)magnesium $(Cp_5H_5)_2Mg$.

An AlxGa(1−x)N layer with a constant Al content (6) is deposited on the surface of the produced columns in order to produce a layer, depending on the needs, with a proper conductance type of n or p or undoped, which constitutes a basal layer for producing the complete structure of a light-emitting diode, e.g. in the range of UV, VIS or that of another device. It is possible to exclude this layer and extend the crystallisation time of the preceding layer, meaning AlxGa(1−x)N, proceeding with a variable (decreasing) Al content (5).

The invention claimed is:

1. A method for producing light-emitting ultra-violet (UV) column structures using the epitaxy of organometallic compounds of the gaseous phase on a patterned sapphire substrate (PSS) plate having a surface for epitaxy provided with protrusions with a regular shape, having a tip and a side surface, wherein the method comprises the stages of:

A. depositing a low-temperature AlN nucleation layer (2) on the side surface of a protrusion (8) and on the tip (9) of the protrusion (8), by that in a temperature from 600° C. to 750° C. with a pressure within a range from 0 to 200 mbar the flow of gases is triggered: trimethylaluminium (TMA) 5 ml/min and ammonia (NH3) 300 ml/min for a duration from 30 seconds to 6 minutes, with a simultaneous rotation of the PSS substrate (1) in a horizontal plane with a speed from 0 to 100 rpm;

B. growing a grain (10) the tip (9) of the protrusion (8) by increasing the temperature of the PSS substrate (1) with a speed from 30 to 100° C./min, to a temperature in the range from 1100° C. to 1400° C., and annealing for a duration from 1 to 10 minutes, and subsequently, with a pressure within a range from 0 to 200 mbar, triggering the flow of gases: trimethylaluminium (TMA) 50 ml/min and ammonia (NH3) variable linearly from 50 ml/min to 5 ml/min over a duration from 1 to 60 minutes, with a simultaneous rotation of the PSS substrate (1) in the horizontal plane with a speed from 0 to 100 rpm;

C. expanding the grain (10), by that the temperature is maintained within a range from 1100° C. to 1400° C., with a pressure in a range from 0 to 200 mbar, and the flow of gases is maintained: trimethylaluminium (TMA) 50 ml/min and a constant flow of ammonia (NH3) 5 ml/min for a duration from 5 to 15 minutes, with a simultaneous rotation of the PSS substrate (1) in the horizontal plane with a speed from 0 to 100 rpm, preferably 50 rpm;

D. growing a column (11) on a surface of the grain (10) by depositing an AlxGa(1−x)N layer with a decreasing Al content (4), where 0≤x≤1, in that the temperature is maintained within a range from 1100° C. to 1250° C., with a pressure within a range from 0 to 200 mbar, the flow of gases is triggered: trimethylaluminium (TMA) 25 ml/min and the linearly variable flow of trimethylgallium (TMG) from 1 ml/min to 20 ml/min over a duration from 30 to 60 minutes, and the flow of trimethylaluminium (TMA) up to 5 ml/min, with a simultaneous rotation of the PSS substrate (1) in the horizontal plane with a speed from 0 to 100 rpm;

E. depositing another AlxGa(1−x)N layer with a constant Al content (6) on the layer deposited in the stage D, where 0≤x≤1, by that the temperature is maintained within a range from 1100° C. to 1200° C., with the pressure within a range from 0 to 200 mbar, the flow of gases is triggered: trimethylaluminium (TMA) within a range from 5 to 50 ml/min, the flow of trimethylgallium (TMG) from 1 to 50 ml/min for a duration from 1 to 30 minutes, with a simultaneous rotation of the PSS substrate (1) in the horizontal plane with a speed from 0 to 100 rpm.

2. The method according to claim 1, wherein stage A is preceded by an additional stage of cleansing the PSS substrate (1) by its preliminary annealing in an atmosphere of $H_2$ and/or $N_2$ their mixtures, with the pressure within a range from 0 to 200 mbar, and a temperature from 1000° C. to 1400° C., with a simultaneous rotation of the PSS substrate (1) in the horizontal plane with a speed from 0 to 100 rpm.

3. The method according to claim 2, wherein after the stage of cleansing, the temperature of the PSS substrate (1) is lowered to a temperature within a range from 600° C. to 750° C., with a speed from 50° C. to: 200° C./min.

4. The method according to claim 1, wherein the doping of the AlxGa(1−x)N layer with a constant Al content (6) is carried out in stage E, where 0≤x≤1, by an n-type dope, and/or a p-type dope, by that a compound comprising the dopant or a precursor selected from a group comprising: silane $SiH_4$, Bis(cyclopentadienyl)magnesium $(Cp_5H_5)_2Mg$, is added to the growth environment in which the growth proceeds.

* * * * *